United States Patent
Tsai et al.

(10) Patent No.: US 6,461,230 B1
(45) Date of Patent: Oct. 8, 2002

(54) CHEMICAL-MECHANICAL POLISHING METHOD

(75) Inventors: Teng-Chun Tsai, Hsinchu; Hsueh-Chung Chen, Taipei Hsien; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 21 days.

(21) Appl. No.: 09/689,045

(22) Filed: Oct. 12, 2000

(30) Foreign Application Priority Data

Sep. 25, 2000 (TW) ........................................ 89119718 A (51) Int. Cl.⁷ ................................................. B24B 1/00
(52) U.S. Cl. .............................. 451/57; 451/41; 451/60; 51/307; 438/692
(58) Field of Search ............................... 451/28, 41, 60, 451/36, 37, 285–289; 51/307–309; 252/79.1; 156/345; 438/692–693; 216/88–89, 95

(56) References Cited

U.S. PATENT DOCUMENTS

| | | | | |
|---|---|---|---|---|
| 4,059,929 A | * | 11/1977 | Bishop | 451/60 |
| 4,184,991 A | * | 1/1980 | Scheurman | 260/29.6 |
| 6,059,920 A | * | 5/2000 | Nojo et al. | 156/345 |
| 6,066,030 A | * | 5/2000 | Uzoh | 451/41 |
| 6,120,354 A | * | 9/2000 | Koos et al. | 451/41 |
| 6,234,877 B1 | * | 5/2001 | Koos et al. | 451/41 |
| 6,261,158 B1 | * | 7/2001 | Holland et al. | 451/63 |
| 6,274,478 B1 | * | 8/2001 | Farkas et al. | 438/626 |

* cited by examiner

*Primary Examiner*—George Nguyen
(74) *Attorney, Agent, or Firm*—J.C. Patents (57) ABSTRACT

A method for changing the polishing selectivity ratio of slurry used in chemical-mechanical polishing. Barrier slurry and a diluent are mixed together at different ratios to produce a mixture containing different amounts of solvent, chemicals and polishing particles. Hence, a variety of polishing selectivity ratios between copper film or barrier layer and other materials is obtained. The mixture is transported to the polishing pad of a polishing station to carry out chemical-mechanical polishing.

13 Claims, 6 Drawing Sheets

CHEMICAL-MECHANICAL POLISHING METHOD

CROSS-REFERENCE TO RELATED APPLICATION

This application claims the priority benefit of Taiwan application serial no. 89119718, filed Sep. 25, 2000.

BACKGROUND OF THE INVENTION

1. Field of Invention

The present invention relates to a chemical-mechanical polishing method. More particularly, the present invention relates to a method for changing the polishing selectivity ratio of slurry used in chemical-mechanical polishing.

2. Description of Related Art

As soon as semiconductor production enters the deep sub-micron and copper conductive wire era, dual damascene process will become an indispensable part of the fabrication process. Chemical-mechanical polishing of copper is a closely related technique in the dual damascene process.

To produce sophisticated integrated circuits with sufficient interconnecting wires on a limited chip surface, most silicon chip contains a multiple of metallic layers. In the conventional method, a multi-layered interconnect is formed by forming a via opening in a dielectric layer and then filling the opening with conductive material to form a via plug. Thereafter, a metallic layer is formed over the via plug. Conventional photolithographic and etching techniques are used to pattern out a metal wire. However, when the metallic layer is patterned by etching, some defects are likely produced in addition to the difficulties in dry etching a metal. The dual damascene process is a feasible substitute for the conventional fabrication process because the etching of dielectric material is much easier. A dual damascene process is formed by first etching a dielectric layer to form a via opening that connects with an underlying metallic line. A shallow trench is also formed in the dielectric layer serving as the location for forming an upper metallic line. Copper is deposited into the via opening and the shallow trench and then chemical-mechanical polishing is conducted to remove excess metal and planarize the copper layer.

In conventional dual damascene processes, important factors that have an effect on the chemical-mechanical polishing of copper include temperature, pH value, pressure applied on the chip during polishing, rotational speed of the polishing pad and material constituting the polishing pad. However, the most important factor is the constituents of slurry. The constituents of the slurry can directly affect the polishing selectivity of a particular polishing operation. Currently, development of chemical-mechanical polishing is heading towards improving planarity, increasing polishing rate, increasing etching selectivity between different polishing materials and improving the accuracy of end-point detection.

In general, chemical-mechanical polishing of a copper layer is carried out in two stages. A copper slurry is used in the first stage to remove excess metal above the barrier layer but polishing is stopped above the barrier layer, just before the barrier layer is completely removed. Barrier slurry is used in the second stage to remove any residual barrier layer but stopping above the dielectric layer. In the second stage, the effect of slurry on polishing selectivity between copper film, the barrier layer and the dielectric layer is most critical. In the conventional process, differences in stress between various materials and difference in polishing selectivity of slurry often lead to dishing of the metallic layer. This has the effect of reducing overall cross-sectional area of metallic lines and increasing metallic line resistance.

Figure 1:
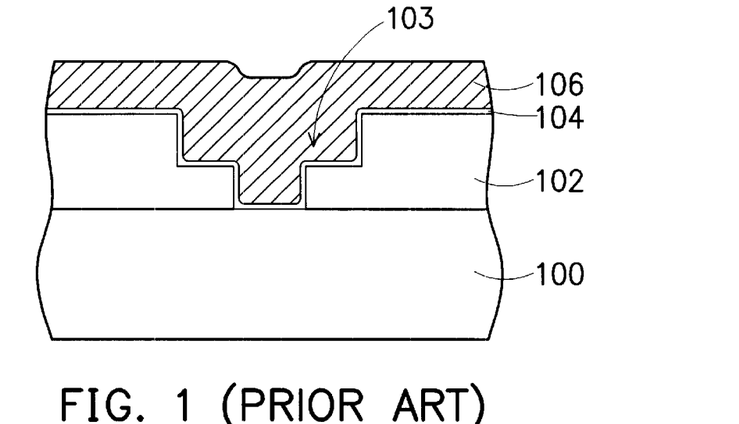
FIGS. 1 through 3 are schematic cross-sectional views showing the steps for producing a conventional dual damascene structure.
Figure 2:
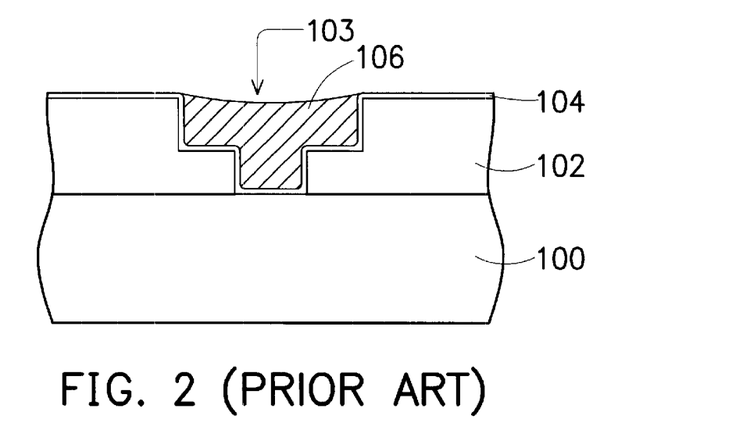
Figure 3:
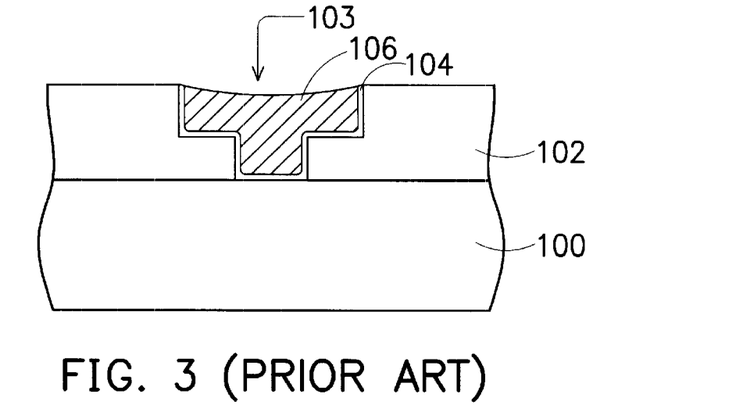

The following is a description of a two-stage chemical-mechanical polishing in a conventional dual damascene process. FIGS. 1 through 3 are schematic cross-sectional views showing the steps for producing a conventional dual damascene structure. As shown in FIG. 1, a substrate 100 having a dielectric layer 102 thereon is provided. The dielectric layer 102 can be a silicon dioxide layer or other low dielectric constant material. A via opening that exposes a portion of the substrate 100 is formed in the dielectric layer 102. A shallow trench is formed over the via opening for forming a metallic line. The via opening together with the shallow trench form a dual damascene opening 103. A barrier layer 104 conformal to the dual damascene opening 103 is formed over the exposed surface of the substrate 100. The barrier layer 104 can be a titanium/titanium nitride or a tantalum/tantalum nitride layer, for example. Finally, a metallic layer 106 is formed over the barrier layer 104.

As shown in FIG. 2, copper slurry is used in a first stage polishing operation to remove excess metal from the metallic layer 106 outside the opening 103 and above the barrier layer 104. The polishing operation stops before the barrier layer 104 is completely removed. The main constituent of the copper slurry can be a neutral substance such as aluminum oxide ($Al_2O_3$), but the main constituent of the copper slurry can also be an acid substance such as silicon dioxide ($SiO_2$).

As shown in FIG. 3, barrier slurry is used in a second stage polishing operation to remove residual barrier layer 104. The polishing operation stops above the dielectric layer 102. The barrier slurry can be an acid or a basic silicon dioxide solution. In brief, a conventional chemical-mechanical polishing involves removing excess copper in the copper layer 106 using a copper slurry and then removing the barrier layer 104 using a barrier slurry. Since both the copper slurry and the barrier slurry have a fixed polishing rate relative to various substances, dishing of the metallic layer 106 frequently occurs after polishing.

SUMMARY OF THE INVENTION

Accordingly, one object of the present invention is to provide a method for changing polishing selectivity ratio of slurry in a chemical-mechanical polishing process.

To achieve these and other advantages and in accordance with the purpose of the invention, as embodied and broadly described herein, the invention provides a method for changing polishing selectivity ratio of slurry. The invention involves mixing barrier slurry with a diluent at different ratios so that a variety of different polishing selectivities are obtained. The diluent is capable of maintaining the pH value of the original slurry. The mixture is transported to the polishing pad of a polishing station to carry out polishing. The diluent is a buffer solution capable of maintaining a constant pH value. The diluent, for example, can be a solution of de-ionized water with benzotriazole (BTA, $C_6H_5N_3$) or a solution of de-ionized water with BTA and polyacrylic acid (PAA).

According to the invention, slurry and diluent are mixed in different ratios to modify the relative content of solvents, chemicals and slurry particles within the barrier slurry. Hence, different polishing selectivity ratios are obtained between the copper film, the barrier layer and the dielectric layer (including low dielectric constant material). By changing the polishing selectivity ratio through mixing constituents in different amount, dishing of the metallic layer is prevented. The diluent and the slurry can be transported to the polishing pad through separate pipelines. Alternatively, the diluent and the slurry are separately pumped to the same pipeline and mixed before being delivered to the polishing pad for polishing.

The slurry used in chemical-mechanical polishing is modified in-situ so that polishing selectivity ratio between different material layers can be adjusted to obtain the optimal polishing results.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In this invention, barrier slurry and diluent are mixed together in different proportions to adjust polishing rate with respect to different materials so that an optimal planarization is obtained after a chemical-mechanical polishing step. The diluent used in this invention is a buffer solution capable of maintaining a constant pH value. The diluent, for example, can be a solution of de-ionized water with benzotriazole (BTA, $C_6H_5N_3$) or a solution of de-ionized water with BTA and polyacrylic acid (PAA).

Figure 4A:
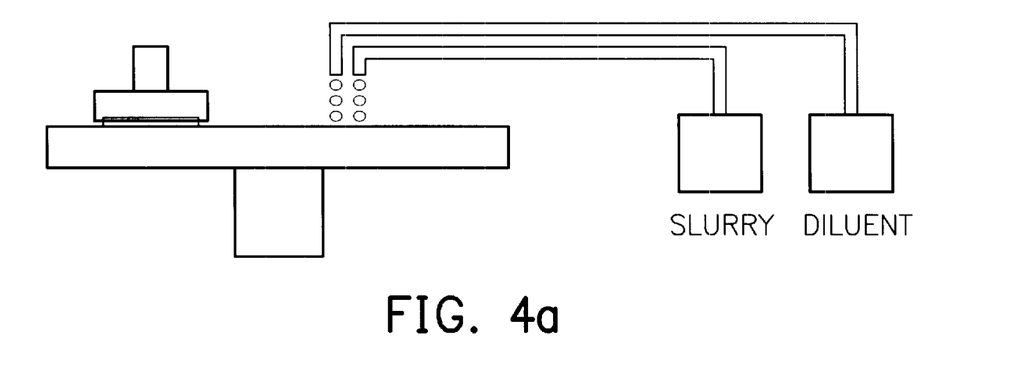
FIG. 4a is a diagram showing slurry and diluent transported through different pipelines to a polishing pad according to this invention.
Figure 4B:
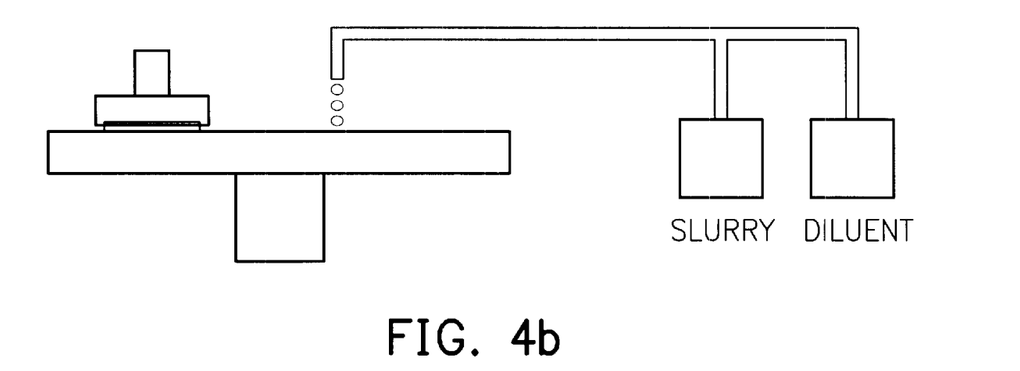
FIG. 4b is a diagram showing slurry and diluent transported to the same pipeline from different pumps and mixed before delivering to the polishing pad according to this invention.
Figure 4C:
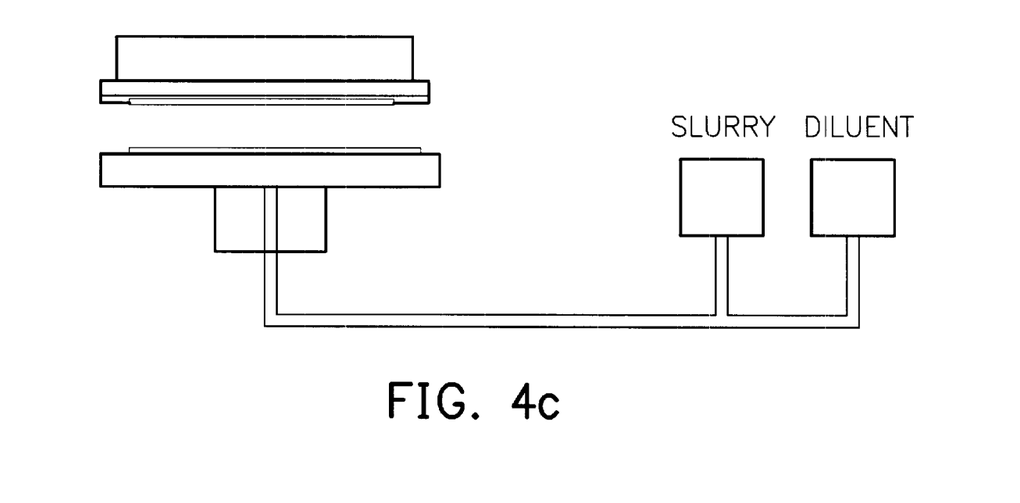
FIG. 4c is a diagram of an alternative arrangement showing slurry and diluent transported to the same pipeline from different pumps and mixed before delivering to the center of the polishing pad from below according to this invention.

In a dual damascene process, a dual damascene opening is formed above a substrate and then metal such as copper is deposited into the opening. Metal slurry such as copper slurry is supplied to the polishing pad of a chemical-mechanical polisher to carry out necessary polishing. Most of the copper in the copper layer outside the opening and above the barrier layer is removed after the polishing step. When most of the copper layer is removed so that the barrier layer is nearly exposed, barrier slurry and diluent can be mixed in a fixed ratio to continue with the polishing. Slurry can be delivered to the polishing pad of a polishing station in one of three ways shown in FIGS. 4a, 4b and 4c. In FIG. 4a, slurry and diluent are transported through different pipelines to the polishing pad. In FIG. 4b, slurry and diluent are transported to the same pipeline from different pumps and mixed before delivering from the top to the polishing pad below. FIG. 4c is an alternative arrangement showing slurry and diluent transported to the same pipeline from different pumps and mixed before being delivered to the center of the polishing pad from below.

Figure 5:
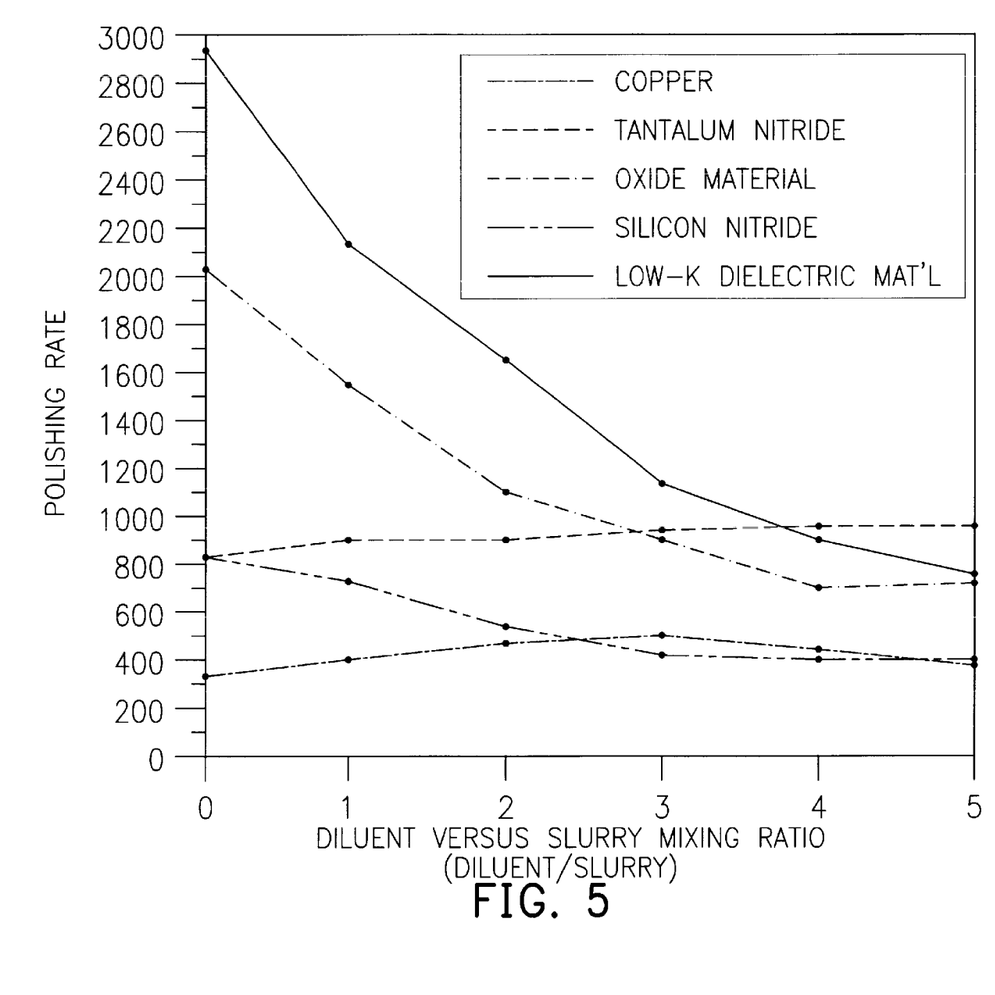
FIG. 5 is a graph showing the relationship between polishing rate for a number of materials and the diluent/slurry mixing ratios according to the invention.

FIG. 5 is a graph showing the relationship between polishing rate for a number of materials and the diluent/slurry mixing ratios according to the invention. As shown in FIG. 5, five different lines representing the polishing rate for copper, tantalum nitride, oxide, silicon nitride and one other low-K material versus the diluent/slurry ratio is shown. A pattern can be observed from the graph. First, the polishing rate of copper and tantalum nitride is little affected by the diluent/slurry ratio. Second, the polishing rate of oxide material, silicon nitride and low-K material will fall considerably when the diluent/slurry ratio is increased. In other words, when the diluent/slurry ratio is low, oxide material, silicon nitride and low-k material will have a high polishing rate. Therefore, according to the trends shown in FIG. 5, polishing selectivity between different materials can be modified by adjusting slurry to diluent ratio.

Figure 6:
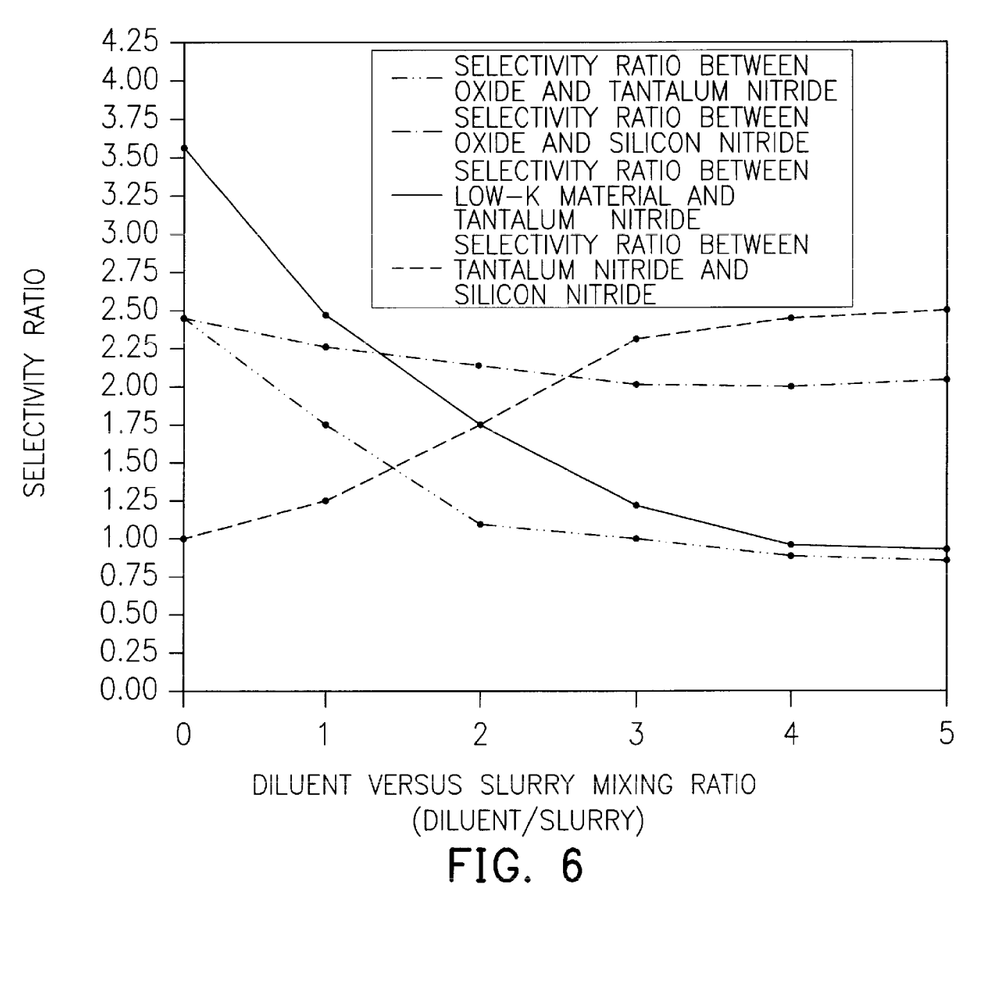
FIG. 6 is a graph showing the relationship between the polishing selectivity ratios of various substances and the diluent/slurry mixing ratios according to the invention.

FIG. 6 is a graph showing the relationship between the polishing selectivity ratios of various substances and the diluent/slurry mixing ratios according to the invention. The four lines in FIG. 6 represent the polishing selectivity ratio of oxide/tantalum nitride, oxide/silicon nitride, low-k material/tantalum nitride, tantalum nitride/silicon nitride versus the diluent/slurry ratio. In fact, the graph in FIG. 6 is derived from FIG. 5. According to FIG. 6, as the diluent/slurry ratio increases, the polishing selectivity ratio of oxide/tantalum nitride drops from 2.45 (with no diluent added) to about 1.00. Similarly, the polishing selectivity ratio of low-k material/tantalum nitride drops from 3.55 to about 1.00. On the other hand, the polishing selectivity ratio of tantalum nitride/silicon nitride rises from 1.00 to 2.5. Hence, by adjusting the mixing ratio between diluent and slurry, polishing selectivity ratio can be tailored in whatever direction to prevent dishing of the metallic layer.

To illustrate the advantages of this invention in actual applications, the steps for producing a dual damascene structure is described below. However, the invention is not limited to such an application. In fact, the method of this invention can be applied to other materials and processes that require chemical-mechanical polishing.

Figure 7:
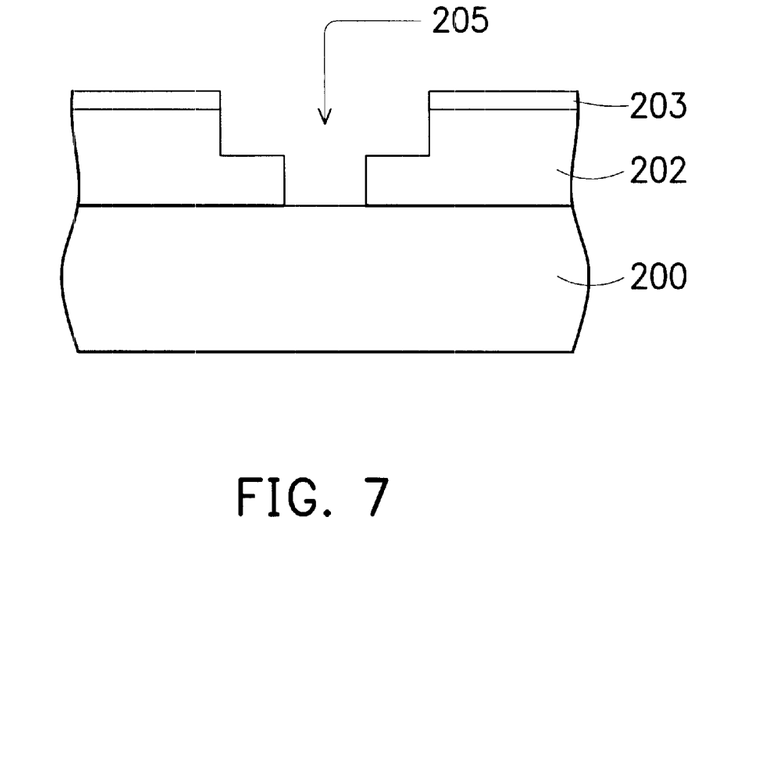
FIGS. 7 through 10 are cross-sectional views showing the progression of steps for forming a dual damascene structure according to this invention.

FIGS. 7 through 10 are cross-sectional views showing the progression of steps for forming a dual damascene structure according to this invention. As shown in FIG. 7, a substrate 200 having a dielectric layer 202 thereon is provided. The dielectric layer 202 can be a silicon dioxide layer or other low-k dielectric layer formed, for example, by low-pressure chemical vapor deposition or spin-on deposition. If the dielectric layer 202 is a low-k dielectric layer, a cap layer 203 is formed over the low-k dielectric layer to prevent damage to the low-k dielectric layer during polishing. The cap layer 203 can be a silicon nitride layer or a silicon carbide layer, for example. A via opening that exposes a portion of the substrate 200 is formed in the dielectric layer 202. A shallow trench is formed in the cap layer 203 and the dielectric layer 202. The shallow trench is the location for forming an upper metallic line. The shallow trench together with the via opening form a dual damascene opening 205.

Figure 8:
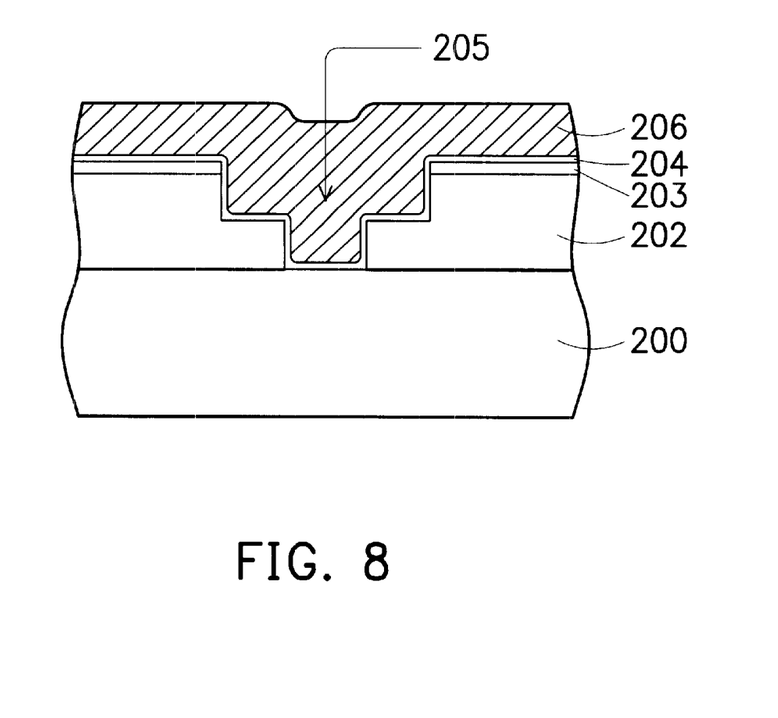

As shown in FIG. 8, a barrier layer 204 conformal to the dual damascene opening 205 is formed. The barrier layer can be a tantalum/tantalum nitride layer formed, for example, by forming a tantalum layer through DC magnetron sputtering and then nitriding the tantalum layer to form a tantalum nitride layer. A metallic layer 206 such as a copper layer is formed over the barrier layer 204.

Figure 9:
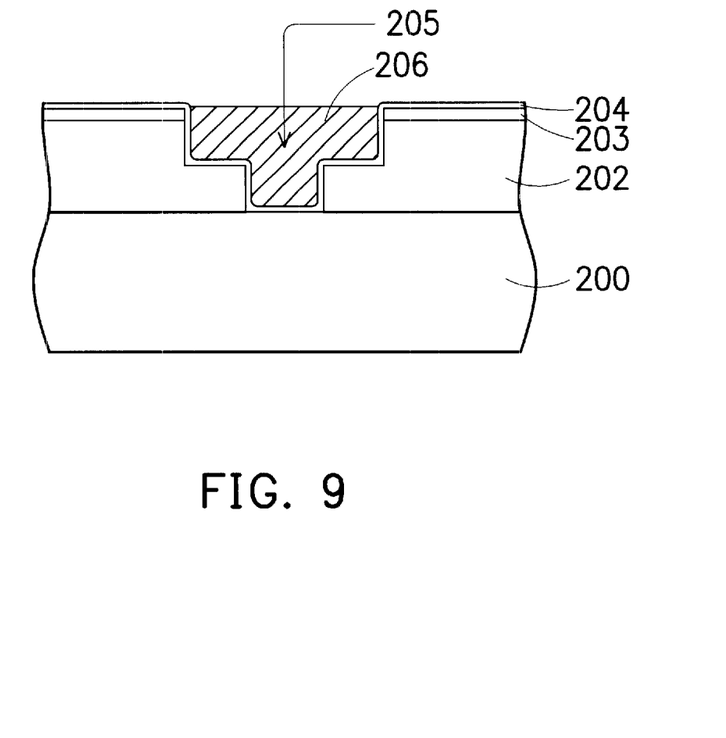

As shown in FIG. 9, chemical-mechanical polishing of the metallic layer 206 is carried out. Copper slurry is delivered to the polishing pad on a chemical-mechanical polishing station and excess copper in the copper layer 206 outside the dual damascene opening 205 and above the barrier layer 204 is removed. When the barrier layer 204 is exposed, slurry mixed with diluent is a fixed ratio is delivered to the polishing pad for removing the barrier layer. Note that barrier slurry and the diluent must be mixed in a ratio that meets the condition such as a high polishing selectivity ratio between the barrier layer and the underlying cap layer or dielectric layer.

Figure 10:
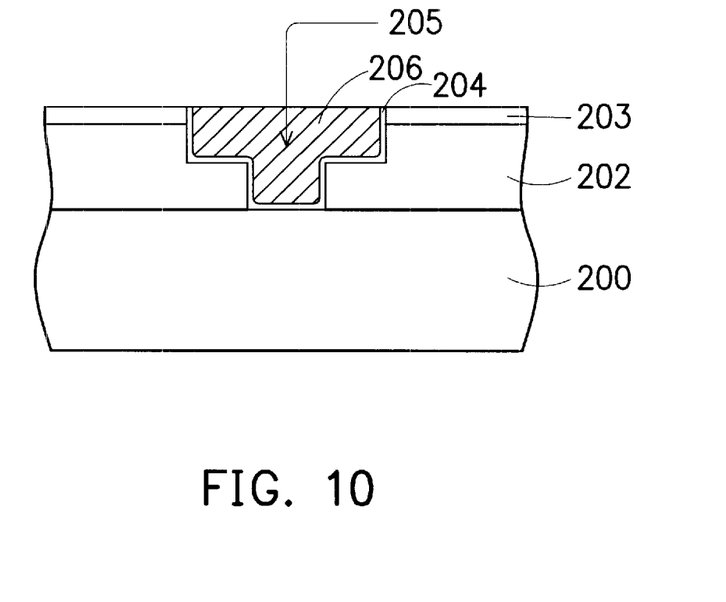

As shown in FIG. 10, consideration regarding the removal of the barrier layer 204 includes factors such as barrier layer thickness and cap layer material (for example, silicon nitride). When the barrier layer 204 is polished to expose the cap layer 203, a portion of the cap layer 203 may be removed due to slight discrepancy in end-point judgement. However, if the dielectric layer 202 is a silicon dioxide layer, no cap layer 203 is formed. Under such circumstances, the barrier layer 204 is formed directly above the dielectric layer 202. No matter if the cap layer 203 is required or not, the required composition of the slurry can be obtained by referring to FIG. 6. Using a proper mixed diluent/barrier slurry to carry out the polishing of the barrier layer 204, loss in thickness for the cap layer 203 or the dielectric layer 202 during polishing can be minimized. This is because a slurry having a high polishing selectivity ratio between the barrier layer 204 and the cap layer 203 or the dielectric layer 202 is used. In the aforementioned step of polishing the barrier layer 204, the diluent and the slurry are mixed in a fixed ratio. However, in practice, mixing ratio between the diluent and the slurry may vary in stages or may vary continuously with time to optimize a particular polishing operation.

In the above embodiment, barrier slurry is added to the diluent to carry out the removal of a barrier layer in chemical-mechanical polishing. In reality, the invention can also be applied to polishing a copper layer.

In summary, one major aspect of this invention is the capacity to modify the polishing selectivity ratio via in-situ mixing of slurry with a diluent. Another aspect of this invention is the freedom to increase polishing rate for reducing polishing time or to obtain a higher polishing selectivity ratio instantaneously through adjusting diluent-slurry ratio. Finally, adjusting polishing selectivity ratio can minimize the amount of dishing on the upper surface of a metallic layer after chemical-mechanical polishing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chemical-mechanical polishing method, comprising the steps of:

providing a substrate having a dielectric layer thereon;

forming a dual damascene opening in the dielectric layer;

forming a barrier layer conformal to the dual damascene opening;

forming a metallic layer over the barrier layer;

performing a first chemical-mechanical polishing operation using a first slurry to remove the metallic layer to expose the barrier layer; and mixing a second slurry with a diluent to form a mixture and then carrying out a second chemical-mechanical polishing to remove the barrier layer using the mixture, wherein the diluent includes a solution of de-ionized water with benzotriazole (BTA, $C_6H_5N_3$) or a solution of de-ionized water, benzotriazole (BTA, $C_6H_5N_3$) and polyacrylic acid (PAA).

2. The method of claim 1, wherein the second chemical-mechanical polishing step further includes the sub-steps of:

mixing the diluent and the second slurry to form a first mixture with a first mixing ratio and chemical-mechanically polishing to remove a portion of the barrier layer with the use of the first mixture; and mixing the diluent and the second slurry to form a second mixture with a second mixing ratio and chemical-mechanically polishing to remove the remaining portion of the barrier layer with the use of the second mixture.

3. The method of claim 1, wherein the diluent includes a buffer solution capable of maintaining a constant pH value.

4. The method of claim 1, wherein the dielectric layer has a cap layer on top.

5. The method of claim 1, wherein material forming the barrier layer includes tantalum/tantalum nitride.

6. The method of claim 1, wherein material forming the metallic layer includes copper.

7. A chemical-mechanical polishing method, comprising the steps of:

providing a substrate having a dielectric layer thereon;

forming a dual damascene opening in the dielectric layer;

forming a barrier layer conformal to the dual damascene opening;

forming a metallic layer over the barrier layer; and mixing a slurry and a diluent to form a mixture and then carrying out a chemical-mechanical polishing to remove the barrier layer using the mixture;

wherein the diluent includes a mixture of de-ionized water, benzotriazole (BTA, $C_6H_5N_3$) and polyacrylic acid (PAA).

8. A method of changing polishing selectivity ratio of slurry in a chemical-mechanical polishing operation, comprising the steps of:

providing slurry;

providing a diluent including a solution of de-ionized water and benzotriazole (BTA, $C_6H_5N_3$) or a solution of de-ionized water, benzotriazole (BTA, $C_6H_5N_3$) and polyacrylic acid (PAA); and mixing the slurry and the diluent to form a mixture and performing a chemical-mechanical polishing operation using the mixture.

9. The method of claim 8, wherein the slurry includes a slurry for removing a barrier layer.

10. The method of claim 8, wherein the diluent is a buffer solution capable of maintaining a constant pH value.

11. The method of claim 8, wherein mixing ratio between the slurry and the diluent is a variable that depends on processing requirements.

12. A method of chemical-mechanical polishing a substrate on which a dielectric layer having a dual damascene opening therein is formed, wherein a barrier layer is formed conformal to the dual damascene opening, and a metallic layer is formed over the dielectric layer to fill the dual damascene opening, the method comprising:

performing a first chemical-mechanical polishing operation using first slurry to removing the metallic layer to expose the barrier layer; and mixing a second slurry with a diluent to form a mixture and then carrying out a second chemical-mechanical polishing to remove the barrier layer using the mixture mixing the diluent and the second slurry to form a first mixture with a first mixing ratio and chemical-mechanically polishing to remove a portion of the barrier layer with the use of the first mixture; and mixing the diluent and the second slurry to form a second mixture with a second mixing ratio and chemical-mechanically polishing to remove the remaining portion of the barrier layer with the use of the second mixture.

13. The method of claim 12, wherein the diluent includes a solution of de-ionized water with benzotriazole (BTA, $C_6H_5N_3$) or a mixture of deionized water, benzotriazole (BTA, $C_6H_5N_3$) and polyacrylic acid (PAA).

* * * * *